United States Patent
Sasaki et al.

[19]

[11] Patent Number: 6,118,517
[45] Date of Patent: *Sep. 12, 2000

[54] MASK PATTERN FOR ALIGNMENT

[75] Inventors: Takahiro Sasaki; Hajime Takaoka, both of Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/919,269

[22] Filed: Aug. 28, 1997

[30] Foreign Application Priority Data

Aug. 29, 1996 [JP] Japan .................................. 8-229094

[51] Int. Cl.⁷ ............................. G03B 27/42; G03B 27/54
[52] U.S. Cl. ................................................. 355/53; 355/67
[58] Field of Search ................................. 355/18, 53, 67, 355/77; 356/399, 400, 401; 250/548; 430/5, 22, 30

[56] References Cited

U.S. PATENT DOCUMENTS

| | | | |
|---|---|---|---|
| 4,269,505 | 5/1981 | Mayer | 355/62 |
| 4,768,883 | 9/1988 | Waldo et al. | 356/399 |
| 5,331,371 | 7/1994 | Mori et al. | 355/53 |
| 5,524,131 | 6/1996 | Uzawa et al. | 378/34 |
| 5,601,957 | 2/1997 | Mizutani et al. | 430/22 |
| 5,640,243 | 6/1997 | Koitabashi et al. | 356/401 |
| 5,691,115 | 11/1997 | Okamoto et al. | 430/311 |
| 5,715,063 | 2/1998 | Ota | 356/400 |
| 5,795,687 | 8/1998 | Yasuda | 430/22 |
| 5,995,199 | 11/1999 | Shinozaki et al. | 355/53 |

FOREIGN PATENT DOCUMENTS

| | | |
|---|---|---|
| 0 626 623 A2 | 11/1994 | European Pat. Off. . |
| 57-88451 | 6/1982 | Japan . |
| 2-1110 | 1/1990 | Japan . |
| 4-102851 | 4/1992 | Japan . |
| 5-315216 | 11/1993 | Japan . |
| 6-324475 | 11/1994 | Japan . |
| 08008156A | 1/1996 | Japan . |

OTHER PUBLICATIONS

United Kingdom Search Report dated Nov. 17, 1997.

*Primary Examiner*—Eddie C. Lee
*Assistant Examiner*—Hung Henry Nguyen
*Attorney, Agent, or Firm*—McGuire, Woods, Battle & Boothe, LLP

[57] ABSTRACT

A reticle mask is provided which allows a determination of an offset amount of a circuit pattern on a mask with respect to reticle alignment marks based on the offset between the reticle alignment marks and position measurement patterns. The position measurement patterns are formed in the circuit pattern area surrounded by a light shielding area, and enables a determination of the offset amount of the circuit pattern with respect to the reticle alignment marks, thereby reducing an offset amount between overlaid circuit patterns.

23 Claims, 4 Drawing Sheets

MASK PATTERN FOR ALIGNMENT

BACKGROUND OF THE INVENTION (a) Field of the Invention

The present invention relates to a mask for alignment, such as a reticle mask for use in a reduction projection aligner and a contact aligner mask, used for a photolithographic technique during the manufacture of a semiconductor integrated circuit, and a method for inspecting such a mask.

(b) Description of the Related Art

A mask in general, and specifically a reticle mask by way of example, comprises a glass substrate having a peripheral region in which a reticle alignment mark is provided and a central region in which a circuit pattern area is surrounded by a stripe light shielding area. Since the alignment mark, the light shielding area and the circuit pattern are defined by an electron-beam lithographic system, it is considered that a high accuracy is achieved in the relative locations among the alignment mark, light shielding area and the circuit pattern. If this is true, it allows an exact transfer of the circuit pattern of the reticle mask onto a semiconductor wafer, by using an exposure technique after indexing of the alignment mark of the reticle mask with respect to a position mark in a pattern formed on the semiconductor wafer during a preceding step.

FIG. 1 shows a reticle mask described in JP-A-4(1992)-102851, which proposes relative position measuring marks 34 on four corners of a glass substrate 36 in order to enable an inspection of positional relationship on the semiconductor wafer among a group of patterns including alignment marks 33, a stripe light shielding area 32 and a circuit pattern area 38 surrounded by the stripe light shielding area 32. It is assumed therein that a high accuracy is established in the relative positional relationship between the reticle alignment marks 33 in the peripheral region and the circuit patterns 31 located in the central region surrounded by the light shielding area, allowing an assumption that substantially no positional offset exits between these patterns.

However, if a drift in the electron beam occurs in the electron-beam lithographic system used to fabricate a mask in the course of drawing a pattern by the electron beam, there occurs an offset between the circuit pattern and the reticle alignment marks in the peripheral region. That is, an exact positioning or indexing is not always achieved with respect to a pattern formed on the semiconductor wafer by utilizing the reticle alignment marks, wherein an offset sometimes occurs between the circuit pattern to be formed and other patterns already formed on the semiconductor wafer. The offset causes a reduction in the yield of semiconductor integrated circuit obtained from the reticle mask. Even if the offset amount may be determined on the semiconductor wafer, there is substantially no way of determining whether it is attributable to the mask itself or the aligner (exposure unit) using the mask.

SUMMARY OF THE INVENTION

It is an object of the present invention to provide a mask which allows a determination of an offset amount of a circuit pattern of the mask based on an alignment mark on the mask, thereby allowing to determine whether the offset on the semiconductor integrated circuit is attributable to the mask or exposure unit, thereby improving the yield of the semiconductor integrated circuits.

It is another object of the present invention to provide an exposure method which reduces an offset between circuit patterns formed on a semiconductor integrated circuit even if there exists an offset between an alignment mark on the mask and the circuit pattern formed on a semiconductor wafer.

The present invention provides a mask for use in an aligner comprising a first region having therein a circuit pattern area and a second region having an alignment pattern, the circuit pattern area having a position measurement pattern for determining an offset amount of the circuit pattern area with respect to the alignment pattern.

In accordance with the mask according to the present invention, an offset amount of a circuit pattern area from a design position on a mask can be determined from the mask itself based on the offset of the position measurement pattern from its design position by determining the coordinates of the position measurement pattern with respect to the alignment mark.

The present invention also provides a method for consecutively exposing a semiconductor wafer through a first mask and a second mask, each of the first and second masks having a first region including a circuit pattern area and a second region including an alignment mark, the method comprising the steps of:

forming first and second position measurement patterns within the circuit pattern areas of the first and second masks, respectively, measuring first and second offset amounts of the first and second position measurement patterns with respect to the alignment marks of the first and second masks, respectively;

determining a possible relative offset amount between the circuit pattern areas of the first and second masks to be overlaid on a semiconductor wafer based on the first and second coordinates; and correcting a position of one of the first and second masks based on the possible relative offset amount.

In accordance with the method according to the present invention, the possible relative offset amount between circuit patterns of respective reticle masks used during different exposure steps with respect to the reticle alignment marks can be determined based on the coordinates of the position measurement patterns, and a corresponding corrections can be applied to an exposure unit to reduce the offset amount of the resultant circuit patterns on the semiconductor wafer.

The above and other objects, features and advantages of the present invention will be more apparent from the following description, referring to the accompanying drawings.

DESCRIPTION OF THE PREFERRED EMBODIMENTS

Figure 1:
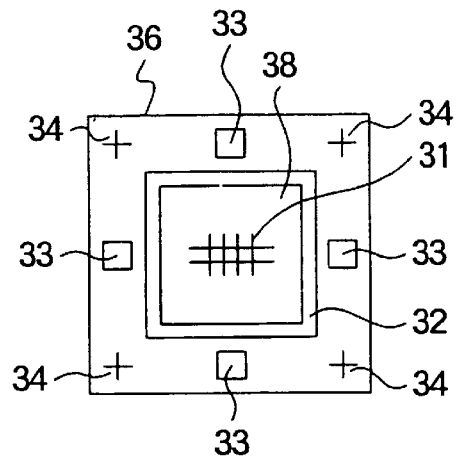
FIG. 1 is a top plan view of a conventional mask.

Now, the present invention is more specifically described with reference to accompanying drawings, wherein similar constituent elements are designated by the same or similar reference numerals.

Figure 2A:
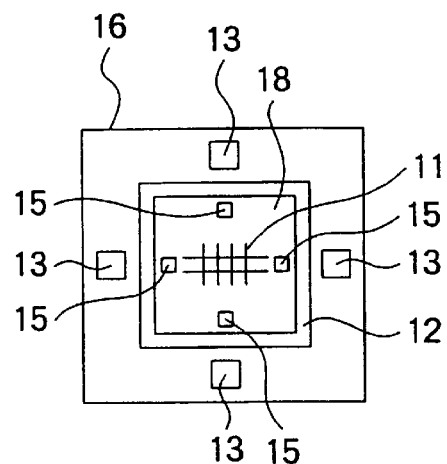
FIGS. 2A and 2B are top plan views of reticle masks according to an embodiment of the present embodiment, showing the absence and the presence of an offset therein, respectively.
Figure 2B:
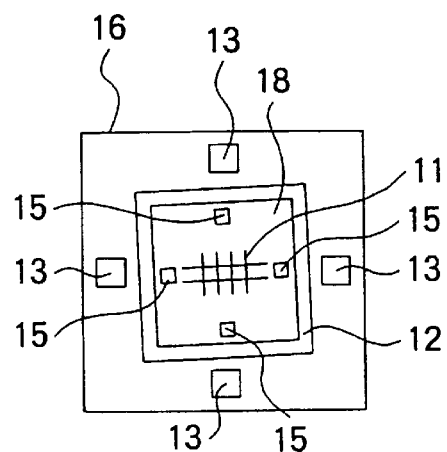

Referring to FIGS. 2A and 2B, each of reticle masks according to an embodiment of the present invention comprises a substantially square glass substrate 16 having a peripheral region in which a reticle alignment mark 13 is provided in the vicinity of each side of the reticle mask and a central square region in which a circuit pattern 11 is formed within a circuit pattern area 18 encircled by a stripe light shielding area 12. In accordance with the present invention, four position measurement patterns 15 are also formed within the circuit pattern area 18 in the vicinities of four sides of the square circuit pattern area 18. The circuit pattern 11, the light shielding area 12, the reticle alignment marks 13 and the position measurement patterns 15 are formed by an electron beam exposure.

FIG. 2A shows the reticle mask wherein substantially no positional offset is present among the circuit pattern 11, the light shielding area 12, the reticle alignment marks 13 and the position measurement patterns 15, whereas FIG. 2B shows the reticle mask wherein a positional offset of the circuit pattern 11, the light shielding area 12 and the position measurement patterns 15 is present with respect to the reticle alignment marks 13.

A drift in the electron beam is likely to occur during the drawing operation, and it is the purpose of providing the position measurement patterns 15 to measure a positional offset of the circuit pattern 11 from its normal position, which offset can be determined relative to the reticle alignment mark 13. In this respect, the position measurement patterns 15 are designed to have an offset amount which is equal to the offset amount of the circuit patterns 11. At this end, the position measurement patterns 15 are formed in the circuit pattern area 18 surrounded by the light shielding area 12 together with the circuit pattern 11.

Figure 3A:
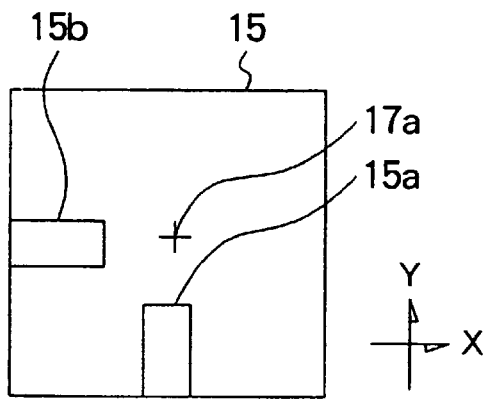
FIGS. 3A and 3B are top plan views of examples of the position measurement pattern shown in FIG. 2A or 2B.
Figure 3B:
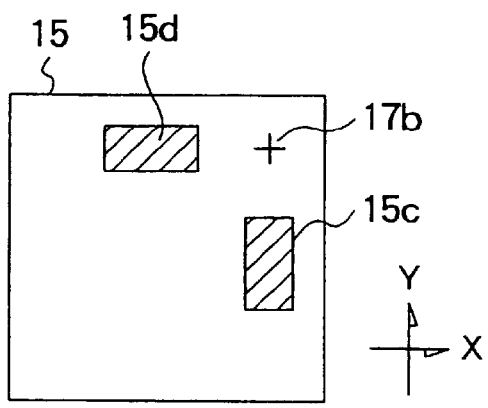

Referring to FIGS. 3A and 3B, a pair of rectangular pattern elements 15a and 15b or 15c and 15d are provided in each of the position measurement patterns 15 shown in FIG. 2A or 2B. It is preferred that at least a short side of the rectangular pattern element 15a, 15b, 15c or 15d has a length measured on the reticle mask ranging from 1 to 40 μm in consideration of the resolution of a measurement unit for the offset amount.

In order to prevent the position measurement pattern 15 of the reticle mask from overlapping with another position measurement pattern, which is already formed on a semiconductor wafer during a previous manufacturing step, the position measurement pattern 15 may be disposed at positions having different coordinates, or alternatively or in addition, the position measurement pattern 15 has a bright or dark pattern element, depending on the dark or bright pattern element in the position measurement pattern 15 already formed by the previous manufacturing step.

The coordinates representing the position measurement patterns 15 formed in the circuit pattern area 18 are first determined with reference to the reticle alignment marks 13 by using a suitable position coordinate measurement unit.

By this step, it is possible to know the offset of the circuit pattern 11 with respect to the reticle arrangement marks 13 on each reticle mask used in each exposure step, and then a possible relative offset amount between the circuit patterns on different reticle masks. By determining the quality of reticle masks from the offset amounts thereof or feeding the offset amount into an exposure unit as a correction value, it is possible to cancel the offset amount between overlaid circuit patterns, thereby preventing a reduction in the yield of semiconductor circuits which may be caused by the offset.

It is desirable that the position measurement pattern 15 be disposed adjacent to a specific pattern combination, referred to as a vernier calipers pattern including a main scale and a vernier scale. The vernier calipers pattern is generally used for determining a positional offset between a circuit pattern formed by a previous step and a circuit pattern on the reticle mask used during a following step.

In the example of FIG. 3A, a pair of rectangular (or stripe) pattern elements 15a and 15b are formed which extend in X- and Y-directions, respectively, from the central reference coordinates 17a of the position measurement pattern 15. To give an example, the larger sides of the rectangular pattern element 15a or 15b have a length equal to 20 μm, and the smaller sides thereof have a length equal to 10 μm. When used in a ⅕ reduction projection aligner, the rectangular pattern elements 15a and 15b are projected onto a semiconductor wafer to have a larger sides which are 4 μm long and a smaller sides which are 2 μm long. As described previously, it is preferred that the smaller sides of the rectangular pattern elements 15a and 15b are in the range from 1 to 40 μm.

In the example of the position measurement pattern 15 shown in FIG. 3B, a pair of rectangular patterns 15c and 15d extend in Y- and X-directions from reference coordinates 17b of the position measurement pattern 15. It will be noted that the reference position 17b is located in the vicinity of a corner of the square pattern 15 and that dark pattern elements 15c and 15d are formed in the present example, which are reversed from the bright pattern elements shown in FIG. 3A.

Figure 3C:
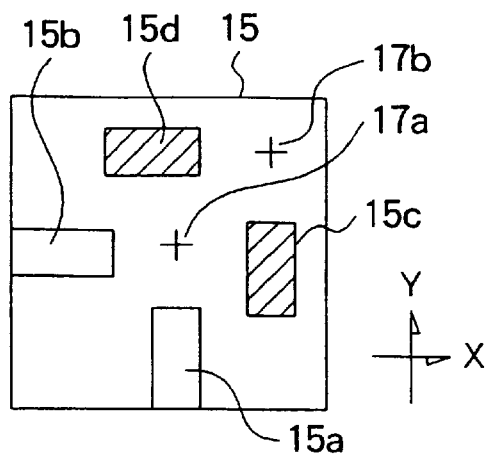
FIG. 3C is a top plan view of a semiconductor wafer having patterns overlaid by using the reticle masks of FIGS. 3A and 3B.

In the position measurement pattern 15 overlaid on a semiconductor wafer by using the reticle masks of FIGS. 3A and 3B, as shown in FIG. 3C, the position measurement patterns 15a and 15b in FIG. 3A and the position measurement patterns 15c and 15d are overlaid in the single position measurement pattern 15. In this manner, if the position measurement patterns are disposed such that different coordinates are used for two reticle masks used during different exposure steps, an overlapping of individual pattern elements 15a, 15b, 15c and 5d of the position measurement patterns 15 can be avoided. Alternatively or in addition, the position measurement pattern 15 on the reticle may be used by reversing the bright and dark pattern elements between different reticle masks.

Thus, after a photolithographic step using the reticle mask shown in FIG. 3A and a subsequent photolithographic step using the reticle mask shown in FIG. 3B, a combinational pattern is formed on the semiconductor wafer which is sized ⅕ of the pattern shown in FIG. 3C.

In the embodiment as described above, the position measurement pattern 15 may be formed inside the light shielding area 2 instead of the circuit pattern area 18. The position measurement pattern 15 allows a determination of a positional offset of the circuit pattern 11 with respect to the reticle alignment marks 13.

Figure 4:
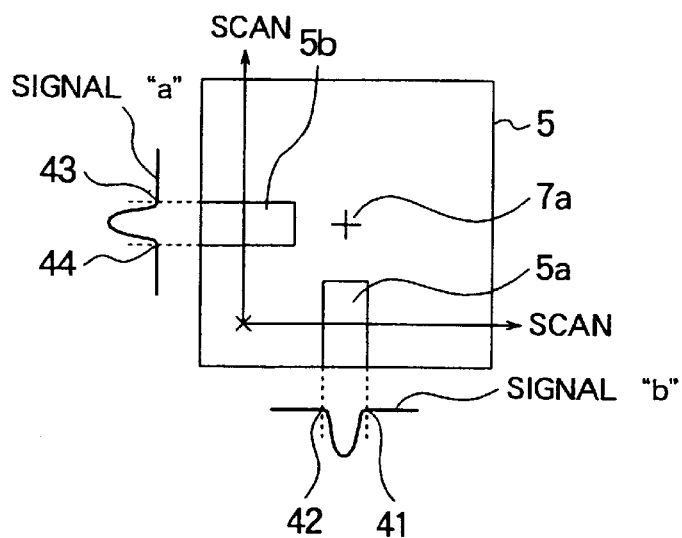
FIG. 4 is a schematic top plan view of the position measurement pattern of FIG. 3A, illustrating the principle of a method for exposing a semiconductor wafer according to an embodiment of the present invention.

Referring to FIG. 4 showing a technique for determining an offset amount of the circuit pattern 11, the offset amount with respect to the reticle alignment marks 13 is determined by scanning the position measurement pattern 15 with a laser beam in the X- and Y-directions.

A position measurement pattern 15, which comprises a pair of rectangular pattern elements 15a and 15b (or 15c and 15d), is previously formed in one or more regions of the circuit pattern 11 according to a known reticle mask fabrication technique together with the circuit pattern 11 and a reticle alignment marks 13.

The reference coordinates 17a of the position measurement pattern 15 are determined with reference to the reticle alignment marks 13 by using the laser beam scanning technique in an optical instrument. This determination may utilize an optical instrument which determines the intensity of either transmitted light or reflected light (or a combination of transmitted light and reflected light) to derive signals a and b for the detected light. From the waveforms of signals a and b, the reference coordinates 17a of the position measurement pattern 15 can be determined.

Specifically, the reference coordinates 17a are determined by a midpoint between the rising edge 41 and the falling edge 42 of the signal a horizontally, and a midpoint between the rising edge 43 and the falling edge 44 of the signal b vertically, as viewed in FIG. 4. After the reference coordinates 17a are determined in this manner, its difference over the design coordinates of the position measurement pattern 15 on the reticle alignment mark 13 is determined, thereby obtaining a offset amount of the position measurement pattern 15. The offset amount of the position measurement pattern 15 with respect to the reticle alignment marks 13 thus determined can be considered as representing an offset amount of the circuit pattern 11 relative to the reticle alignment marks 13 inasmuch as the position measurement pattern 15 is disposed within or in the vicinity of the circuit pattern area 18.

The offset amount of the circuit pattern 11 on each reticle mask with respect to the reticle alignment marks 13 is thus determined after the fabrication of the each reticle. This provides a possible relative offset amount between the circuit patterns of two reticle masks used in the manufacture of a semiconductor integrated circuit. The offset amounts of the respective circuit patterns 11 are input to an exposure unit beforehand to cancel the respective offset amounts among the circuit patterns formed by the overlaying exposure operations. In this manner, a reduction in the yield in the semiconductor integrated circuit as caused by the offset of the circuit pattern can be prevented.

During the manufacture of a semiconductor integrated circuit by using an exposure unit of either projection or reflection type, a number of reticle masks having circuit patterns thereon are used depending on the manufacturing steps. These reticle masks are used in the exposure unit to overlay a circuit pattern of a reticle upon another circuit pattern formed on the semiconductor wafer during a previous manufacturing step.

An offset amount between circuit patterns formed by the overlaying exposures may be caused by a misalignment between the reticle mask and the semiconductor wafer, an offset caused by an error in manufacturing the reticle, and an offset caused by a distortion of a lens used in the exposure unit. Of these, an offset caused by the misalignment between the reticle and a semiconductor wafer can be eliminated by feeding the offset amount to the exposure unit as a correction value. However, it is not a simple matter in a conventional technique to determine if the offset is caused by an error in manufacturing the reticle mask or by a distortion in the lens used in the exposure unit.

Specifically, when examining the presence of an offset by using a positioning pattern generally referred to as a vernier calipers pattern including a main scale and a vernier scale or a positioning pattern such as box in box, it may be found that there is no offset in the positioning pattern formed on the semiconductor wafer while there is an offset in the circuit pattern. Such an offset on the semiconductor wafer may be caused by an error in manufacturing the reticle, and may also be caused by a distortion in the lens used in the exposure unit.

It is possible in the present invention to determine whether the offset is generated during forming a circuit pattern on the semiconductor wafer or the offset is caused by the error in manufacturing the reticle or a distortion of a lens used in the exposure unit, by using the position measurement pattern 15 to determine the relative position of the alignment marks 13 and the position measurement pattern 15 directly on the reticle.

Figure 5:
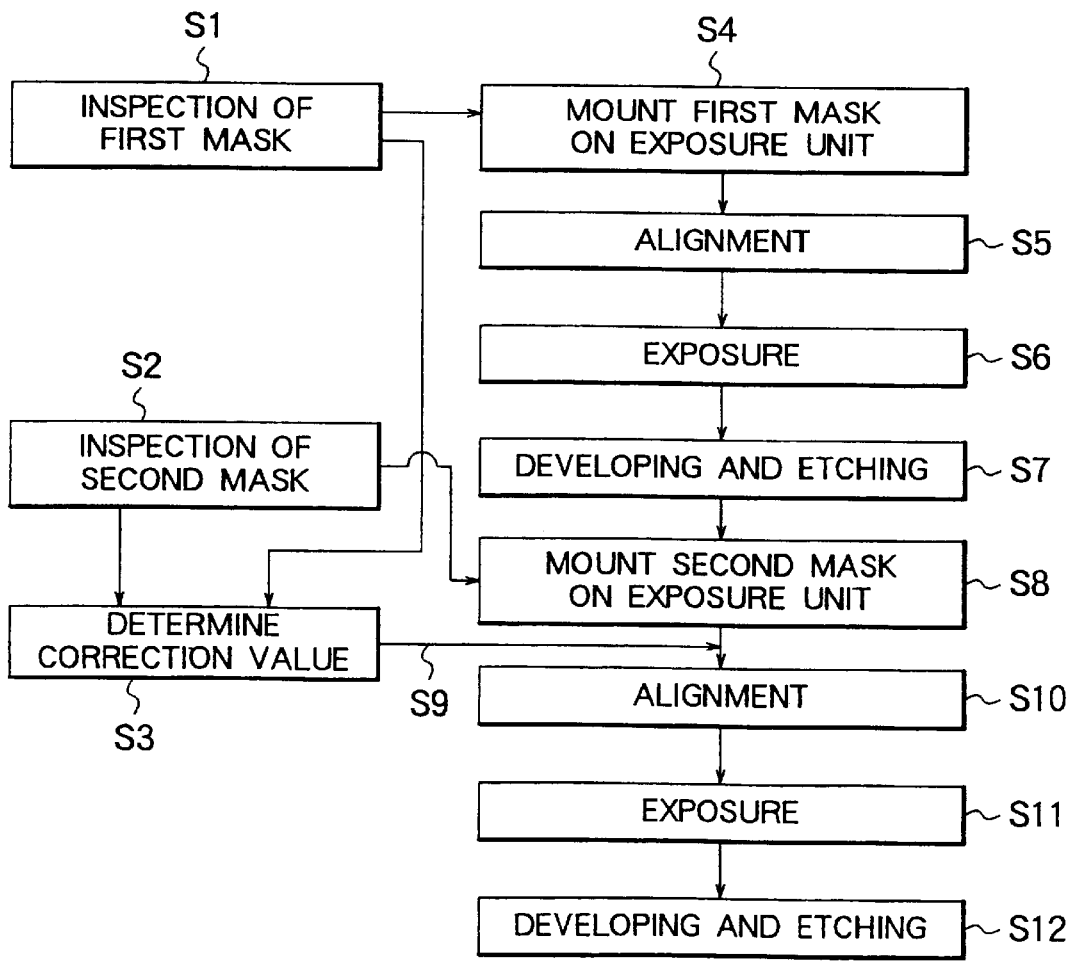
FIG. 5 is a flowchart of a process according to the embodiment mentioned above.

Referring to FIG. 5, an exposure process according to an embodiment of the present invention will now be described. At step S1, an inspection for any positional offset of the circuit pattern 11 on a first reticle mask with respect to the reticle alignment marks 13 is effected by determining the relative positions of the position measurement patterns 15 with respect to the reticle alignment marks 13. The first mask is then mounted on the exposure unit at step S4.

Figure 6A:
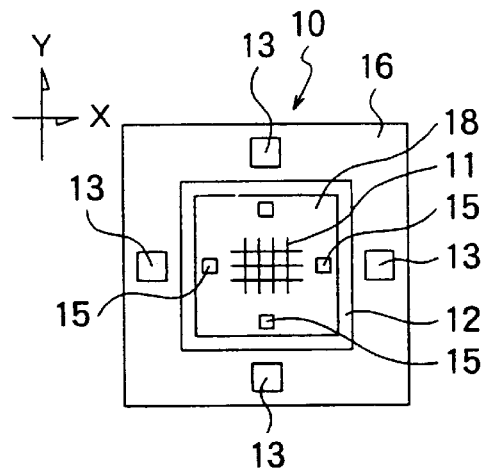
FIGS. 6A and 6B are top plan views of reticle masks used in the process of FIG. 5.

FIG. 6A shows an example of the first reticle mask 10 used in the first photolithographic step. A glass substrate 16 includes a peripheral region in which reticle alignment marks 13 are provided, and a central region in which a circuit pattern area 18 is surrounded by the stripe light shielding area 12. A circuit pattern 11 and four position measurement patterns 15 are formed in the circuit pattern area 18. Whether the circuit pattern 11 and the position measurement patterns 15 are formed at given locations within the circuit pattern area 18 is determined by determining the coordinates of the position measurement patterns 15 with reference to the reticle alignment marks 13.

Before exposure, the reticle alignment marks 13 are aligned at step S5 with the alignment marks previously formed on the semiconductor wafer by another reticle masks. subsequently, an exposure is effected at step S6, then a developing and etching step is effected at step S7 to complete a first photolithographic step.

Figure 6B:
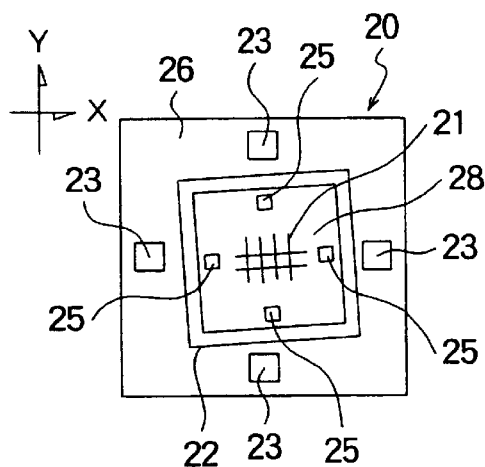

FIG. 6B shows an example of the second reticle mask 20 as used in the second photolithographic step of the process of FIG. 5. A glass substrate 26 includes a peripheral region in which reticle alignment marks 23 are formed, and a central region in which a circuit pattern area 28 including a circuit pattern 21 and four position measurement patterns 25 is surrounded by the light shielding area 22. It is noted that the circuit pattern 21 and the four position measurement patterns 25 in the second reticle mask 20 have a positional offset with respect to the reticle alignment marks 23, and are therefore formed at locations which are shifted from the given locations.

While an offset may comprise a shift in X-or Y-direction, a rotation or an error on scaling factor, an offset caused by rotation is exemplarily illustrated in FIG. 6B. For each of the errors which cause an offset, it is possible in this embodiment to calculate the offset amount by determining the position of the four position measurement patterns 25 with respect to the four reticle alignment marks 23.

An inspection for any positional offset of the circuit pattern 21 relative to the reticle alignment marks 23 on the second mask 20 is effected at steps S2 by determining the position of the four position measurement patterns 25 with respect to the reticle alignment marks 23. Then, the second mask 20 is mounted on the exposure unit at step S8.

At the same time, a correction value is calculated at step S3 based on the offset amount between the coordinates representing the positions of the circuit patterns 11 and 21 with respect to the reticle alignment marks 13 and 23 obtained in the first and second reticle masks 10 and 20. Namely, a positional offset of the circuit pattern 21 on the second mask 20 relative to the circuit pattern 11 on the first mask 10 is calculated as a correction value, at step S3, which is fed at S9 to the exposure unit in order to provide a correction by an amount based on the offset amounts. Then, exposure is effected by using the reticle alignment marks 23 at step S10, followed by an exposure at step S11 and a developing and an etching at step S12, thereby completing the second photolithographic step.

Figure 6C:
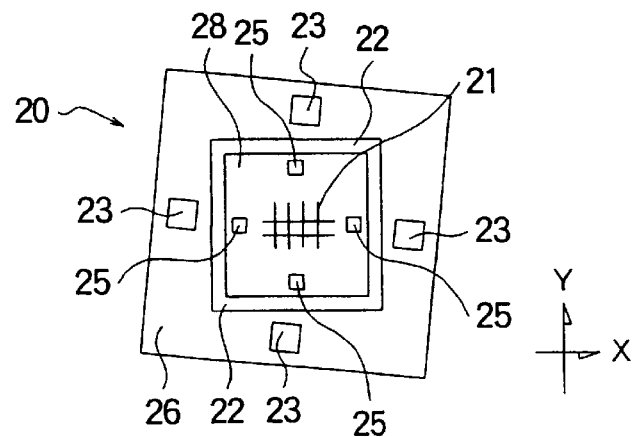
FIG. 6C is a top plan view of the reticle mask of FIG. 6B mounted on an exposure unit for correction.

In the example shown in FIG. 6B, the circuit pattern 21 on the second mask 20 has an offset relative to the reticle alignment marks 23 by rotation, and accordingly, a correction input at step S9 is used to rotate the entire second mask 20 or glass substrate 26 by a corresponding amount during the exposure effected at step S11, as shown in FIG. 6C. In this manner, the circuit pattern 21 is exactly overlaid on the pattern of the semiconductor wafer already formed by the circuit pattern 11 of the first mask 10. The rotational operation itself may be effected by rotating the semiconductor wafer instead of rotating the second mask 20.

In the above description of the exposure method according to the present embodiment, the correction is effected on the second mask used during the second photolithographic step with respect to the first mask used during the first lithographic step. However, a similar correction can be made for the first mask used during the first photolithographic step. Similarly, a corresponding correction can be made between photolithographic steps effected subsequent to the second photolithographic step.

While the embodiment of the present invention has been described above in connection with a reticle mask which is used with a reduction projection aligner, it will be obvious that a similar result can be obtained when the present invention is applied to a contact aligner mask.

Since the above embodiments are described only for examples, the present invention is not limited to the above embodiments and various modifications or alterations can be easily made therefrom by those skilled in the art without departing from the scope of the present invention.

What is claimed is:

1. A mask for an aligner comprising:
   a first region having therein a circuit pattern area;
   a second region having an alignment pattern; and
   a position measurement pattern in said circuit pattern area, said alignment pattern serving as a reference for said position measurement pattern for determining an offset amount of said circuit pattern area,
   wherein said position measurement pattern includes a pair of rectangular pattern elements, one of said rectangular pattern elements having long sides extending perpendicular to long sides of the other of said rectangular pattern elements.

2. A mask as defined in claim 1 wherein small sides of each of said rectangular pattern elements has a length ranging between 1 and 40 μm.

3. A mask as defined in claim 1 wherein said mask is a reticle mask included in a reduction projection aligner.

4. A mask as defined in claim 1 wherein said mask is a contact aligner mask.

5. A mask as defined in claim 1, wherein said alignment pattern includes four alignment marks and said position measurement pattern includes four pattern marks, said offset amount being determined based on a deviation of at least one of said four pattern marks from at least one of said four alignment marks.

6. A mask as defined in claim 5, wherein said four pattern marks are one of bright rectangular patterns and dark rectangular patterns.

7. A mask for an aligner, comprising:
   a first region having therein a circuit pattern area;
   a second region having an alignment pattern; and
   a position measurement pattern in said circuit pattern area, said alignment pattern serving as a reference for said position measurement pattern for determining an offset amount of said circuit pattern area,
   wherein said first region comprises a light shielding area surrounding said circuit pattern area.

8. A mask as defined in claim 7, wherein said position measurement pattern is separated from said light shielding area by a first predetermined amount.

9. A mask as defined in claim 8, wherein said light shielding area is separated from said alignment pattern by a second predetermined amount.

10. A mask for an aligner, comprising:
    a first region including a circuit pattern;
    a second region including an alignment pattern; and
    a position measurement pattern within said first region,
    wherein a degree to which said position measurement pattern deviates from a reference position relative to said alignment pattern is indicative of a positional offset of the circuit pattern of said mask, and
    wherein said alignment pattern includes a predetermined number of alignment marks disposed within said second region, wherein said position measurement pattern includes a predetermined number of position measurement areas, and wherein said reference position corresponds to predetermined positions relative to respective ones of said alignment marks.

11. A mask as defined in claim 10, further comprising:
    a light-shielding area between said first region and said second region.

12. A mask as defined in claim 10, wherein said predetermined number is four.

13. A mask as defined in claim 10, wherein at least one of said position measurement areas includes a predetermined number of first pattern elements.

14. A mask as defined in claim 13, wherein said predetermined number of first pattern elements are disposed at first predetermined coordinate positions within said at least one position measurement area.

15. A mask as defined in claim 14, wherein the first predetermined coordinate positions of said first pattern elements are different from predetermined coordinate positions of second pattern elements disposed in a position measurement area located in another mask, so that when a circuit pattern in said another mask is placed adjacent the circuit pattern in said first region, the first pattern elements do not overlap the second pattern elements.

16. A mask as defined in claim 13, wherein said predetermined number of first pattern elements are of a brightness different from a brightness of second pattern elements in at least one position measurement area of a second mask containing a second circuit pattern, so that no overlap occurs between the first pattern elements and the second pattern elements when the circuit pattern and the second circuit pattern are formed at adjacent positions on a substrate.

17. A mask as defined in claim 13, wherein said first pattern elements have a rectangular shape.

18. A mask as defined in claim 10, wherein said position measurement pattern is disposed adjacent to a predetermined pattern combination.

19. A mask as defined in claim 18, wherein said predetermined pattern combination is a vernier calipers pattern.

20. A mask for use in an aligner, comprising:

a first region including a circuit pattern;

a second region including an alignment pattern;

a light-shielding area between said first region and said second region; and a position measurement pattern within said light-shielding area, the circuit pattern having a predetermined orientation relative to said position measurement pattern, wherein a degree to which said position measurement pattern deviates from a reference position relative to said alignment pattern is indicative of a positional offset of the circuit pattern of said mask.

21. A mask as defined in claim 20, wherein said alignment pattern includes four alignment marks disposed at predetermined positions within said second region, and wherein said position measurement pattern includes four position measurement marks, said positional offset being determined based on a degree to which at least one of said position measurement marks deviates from at least one of said four alignment marks.

22. A mask for an aligner comprising:

a first region having therein a circuit pattern area;

a second region having an alignment pattern; and a position measurement pattern in said circuit pattern area, said alignment pattern serving as a reference for said position measurement pattern for determining an offset amount of said circuit pattern area, wherein said first region comprises a light shielding area surrounding said circuit pattern area.

23. A mask for an aligner, comprising:

a first region including a circuit pattern;

a second region including an alignment pattern; and a position measurement pattern within said first region, wherein a degree to which said position measurement pattern deviates from a reference position relative to said alignment pattern is indicative of a positional offset of the circuit pattern of said mask, wherein said alignment pattern includes a predetermined number of alignment marks disposed within said second region, said position measurement pattern includes a predetermined number of position measurement areas, and said reference position corresponds to predetermined positions relative to respective ones of said alignment marks, and wherein at least one of said position measurement areas includes a predetermined number of first pattern elements.

* * * * *